(12) United States Patent
Sartore

(10) Patent No.: US 8,479,061 B2
(45) Date of Patent: Jul. 2, 2013

(54) SOLID STATE MEMORY CARTRIDGE WITH WEAR INDICATION

(75) Inventor: Ronald H Sartore, Poway, CA (US)

(73) Assignee: AgigA Tech, San Diego, CA (US)

( * ) Notice: Subject to any disclaimer, the term of this patent is extended or adjusted under 35 U.S.C. 154(b) by 0 days.

(21) Appl. No.: 12/566,178

(22) Filed: Sep. 24, 2009

(65) Prior Publication Data

US 2011/0072302 A1    Mar. 24, 2011

(51) Int. Cl.
*G11C 29/00* (2006.01)
*G11C 29/34* (2006.01)

(52) U.S. Cl.
USPC ........................................ 714/723; 365/185.3

(58) Field of Classification Search
USPC ....... 714/718, 719, 723; 365/185.33; 711/103
See application file for complete search history.

(56) References Cited

U.S. PATENT DOCUMENTS

| | | | |
|---|---|---|---|
| 3,916,390 A | 10/1975 | Chang et al. | |
| 5,519,663 A | 5/1996 | Harper, Jr. | |
| 5,519,831 A | 5/1996 | Holzhammer | |
| 6,058,047 A * | 5/2000 | Kikuchi | 365/185.33 |
| 6,295,577 B1 | 9/2001 | Anderson et al. | |
| 6,336,174 B1 | 1/2002 | Li et al. | |
| 6,831,865 B2 * | 12/2004 | Chang et al. | 365/185.33 |
| 7,069,401 B1 | 6/2006 | Noonan et al. | |
| 7,137,027 B2 * | 11/2006 | Shiota et al. | 714/5 |
| 7,167,399 B2 * | 1/2007 | Wooldridge | 365/185.29 |
| 7,277,011 B2 * | 10/2007 | Estakhri | 340/540 |
| 7,451,348 B2 | 11/2008 | Pecone et al. | |
| 7,464,240 B2 | 12/2008 | Caulkins et al. | |
| 7,592,775 B2 | 9/2009 | Altemose et al. | |
| 7,610,433 B2 | 10/2009 | Randell et al. | |
| 7,634,688 B2 | 12/2009 | Madter et al. | |
| 7,661,002 B2 | 2/2010 | Pecone et al. | |
| 7,865,679 B2 | 1/2011 | Sartore | |
| 7,865,761 B1 * | 1/2011 | Chilton | 714/2 |
| 7,990,797 B2 | 8/2011 | Moshayedi et al. | |
| 2001/0055234 A1 | 12/2001 | Mori | |
| 2002/0191471 A1 | 12/2002 | Caulkins | |
| 2003/0095463 A1 | 5/2003 | Shimada et al. | |
| 2004/0030852 A1 | 2/2004 | Coombs et al. | |
| 2004/0103238 A1 | 5/2004 | Avraham et al. | |
| 2004/0158674 A1 | 8/2004 | Cloutier et al. | |
| 2006/0072369 A1 | 4/2006 | Madter et al. | |
| 2006/0198198 A1 | 9/2006 | Fujita et al. | |
| 2006/0212651 A1 | 9/2006 | Ashmore | |
| 2007/0033433 A1 | 2/2007 | Pecone et al. | |
| 2007/0136523 A1 | 6/2007 | Bonella et al. | |
| 2007/0276995 A1 | 11/2007 | Caulkins et al. | |
| 2008/0046638 A1 | 2/2008 | Maheshwari et al. | |
| 2008/0282023 A1 | 11/2008 | Biswas et al. | |
| 2008/0303488 A1 | 12/2008 | Khan | |
| 2009/0027014 A1 | 1/2009 | Sartore | |
| 2010/0306448 A1 | 12/2010 | Chen et al. | |

\* cited by examiner

*Primary Examiner* — James C Kerveros
(74) *Attorney, Agent, or Firm* — FSP LLC

(57) ABSTRACT

A memory cartridge is described that includes a non-volatile memory. The cartridge also includes logic to concentrate memory operations on particular areas of the non-volatile memory to cause the areas of concentration to wear out at an accelerated rate relative to non areas of concentration, and logic to track wear on the non-volatile memory resulting from one or both of erases and writes.

20 Claims, 8 Drawing Sheets

SOLID STATE MEMORY CARTRIDGE WITH WEAR INDICATION

BACKGROUND

Certain nonvolatile memory devices (e.g. NAND flash) exhibit endurance limitations where repeated erasure and writing will ultimately render a memory location (e.g. an addressed "block") unusable. For example, a single level cell (SLC) NAND flash device block may become unusable after 100,000 erase-write cycles; a multi-level-cell (MLC) NAND Flash device block may reach its end-of-life in less than 10,000 cycles.

Numerous schemes have been developed to evenly distribute the actual physical location of write-erasures to extend the useful life of the device/system. These approaches and the algorithms behind them are called "wear leveling". Mostly these approaches are based upon certain data regions not changing often (like software code stored on a hard disk) and reusing the memory locations associated with infrequently changing data for frequently changing data.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
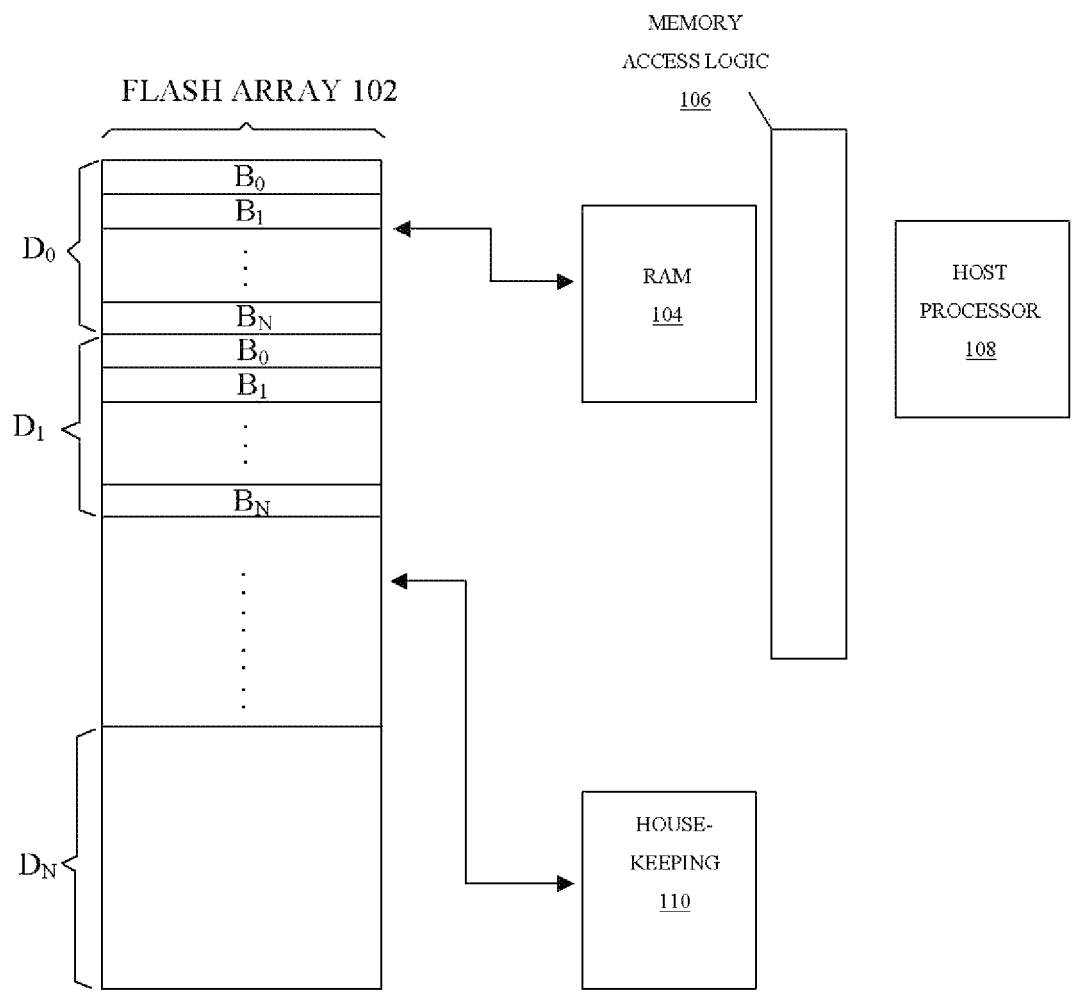
FIG. 1 is an illustration of an embodiment of a memory system.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

Overview

NAND flash memories, because of their small geometries, are the least expensive semiconductor memories today. Their cost-per-bit is presently about one-tenth that of a dynamic RAMs. Unlike DRAMs, NAND flash devices are not randomly accessed.

Described herein are methods, devices, and systems that combine both volatile and non-volatile memory technologies. For example, a dynamic RAM (DRAM) may be used as a cache memory for NAND flash memory devices. Creation of a large virtual nonvolatile RAM may be achieved by combining DRAMs with NAND flash devices and moving data there between. Wear concentration, in contrast to the conventional "wear leveling", may be performed to cause certain of a plurality of NAND flash devices to wear out sooner than others.

The term "cache" is used herein in the conventional sense of a fast, smaller memory providing temporary storage for the contents of larger, slower memory. The term "cache" is also used in a broader sense, to mean a volatile memory technology that provides a random access capability to a nonvolatile memory with less than complete inherent random access capability. Thus, for example, a "cache" RAM memory may act in a conventional caching sense for a flash memory, and/or may provide a random access capability to system components that interact with the flash memory via the RAM memory.

Instead of wear leveling, which attempts to degrade the memory system evenly, specific memory devices may be targeted for the most frequent writes and/or erases by concentrating memory operations on those devices for the purpose of wearing them out sooner.

In general, the wear concentration techniques described herein may be applicable to any memory technology which is subject to wear over time. Although NAND flash memory is described in terms of certain embodiments, the invention is not so limited.

A memory system may thus include a volatile memory and a non-volatile memory, the volatile memory configured as a cache and/or random access memory for the nonvolatile memory. Wear concentration logic may target one or more selected devices of the nonvolatile memory for accelerated wear. The volatile memory may be DRAM and the nonvolatile memory may be NAND flash. The system may include logic to determine when the selected devices are nearing or at end of useful life, and logic to provide an indication to an operator that the selected devices require replacement. The system may include logic to isolate the selected devices from system power and to signal automatically when they are nearing or at end of useful life. A single controller or multiple controllers operating on a memory "slice" of the memory system may map addresses of the nonvolatile memory to addresses of the selected devices. Data may be copied from the selected devices from time to time when the selected devices become full or nearly full of data; the selected devices may then be erased after copying the data. To facilitate wear concentration, some embodiments may include logic to track the write and/or erase frequency of memory locations of the nonvolatile memory.

A device including such a memory system may include a host processor, a volatile memory configured to service memory reads and writes for the host processor; a non-volatile main memory; and wear concentration logic to target one or more selected devices of the nonvolatile memory for accelerated wear, by preferentially redirecting write-backs from the volatile memory to the selected devices. The device may include logic to isolate the selected devices from system power and signals automatically when they are nearing or at end of useful life.

RAM-Flash Memory System with Wear Concentration

FIG. 1 is an illustration of an embodiment of memory system. Flash array 102 comprises multiple flash devices $D_0$, $D_1$, through $D_N$. Each flash device $D_i$ may be separately replaceable from the others. Each flash memory device comprises multiple blocks of memory locations $B_0$, $B_1$ through $B_N$. Flash array 102 is not randomly writable or erasable, but rather it is erasable by device and block location so that an entire block of a particular device is erased at one time. Particular pages of a block may be written once the block is erased.

Data and/or code (e.g. instructions for processor 108) that are accessed frequently may be stored in RAM 104. The randomly addressable RAM 104 may effectively cache commonly accessed data and code stored in the flash array 102 due to the RAM 104 being smaller and faster than the flash array 102. The RAM 104 is also typically much more expensive on a unit basis than is the flash array 102. Certain types of flash 102, such as NAND Flash, are not randomly addressable. Those skilled in the art will recognize that the various components may communicate with one another using one or more busses.

The processor 108 may generate addresses for reading and writing data. Memory access logic 106 may translate addresses in the flash array 102 to addresses in the RAM 104. Thus, when the processor reads or writes from the flash array 102, those reads and writes are translated by the logic 106 to reads and writes to the RAM 104. The logic 106 may concentrate the mapping of RAM memory locations to physical addresses in a single device of the flash array 102, or to a targeted set of devices. For example, flash device $D_0$ may be targeted for accelerated wear.

The RAM 104 may act as a cache memory for the flash array 102. Therefore, the RAM 104 may perform write-backs of modified data that is replaced in the RAM 104. Write backs from RAM 104 may be concentrated to a device or devices of the flash 102 targeted for accelerated wear. The targeted device(s) will thus experience many more writes and erases than other devices of the array 102. They will consequently wear out sooner than other devices in the flash array 102.

House-keeping logic 110 may now and then rearrange data among the flash array devices. This may assist with flash wear concentration by moving less frequently accessed data out of the targeted device(s) (where it would inhibit wear concentration) into other devices of the flash array, to make room in the targeted device for more frequently written data items. Housekeeping may be performed on a periodic basic, and/or as needed to maintain wear concentration progress in the target device(s).

In some embodiments, multiple flash devices are targeted together for accelerated wear. This may improve bandwidth between the RAM 104 and the flash 102. The entire targeted set of flash devices will wear out faster than the others and will require replacement around the same time.

Figure 2:
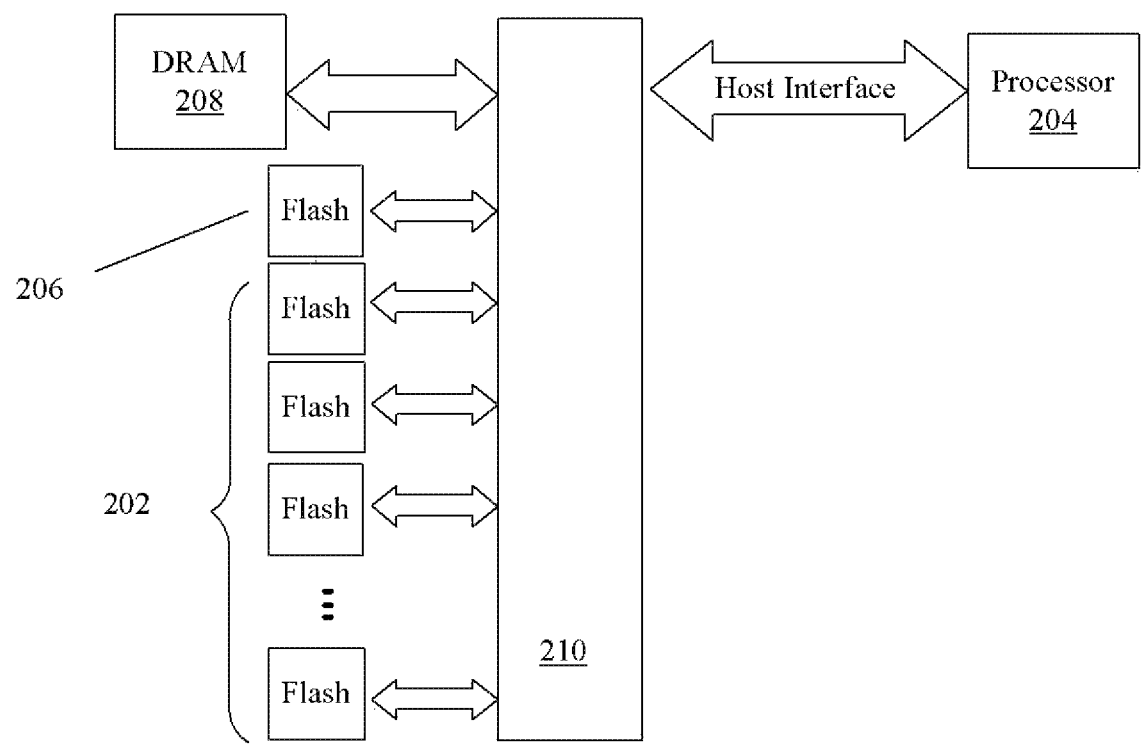
FIG. 2 illustrates an embodiment of system employing memory wear concentration.

FIG. 2 illustrates an embodiment of system employing flash memory wear concentration. Flash devices 202 receive system power and store data and/or instructions (code) for use by a host system processor 204. The host system processor 204 operates on a virtual nonvolatile memory address space corresponding to contents of the flash 202. In this example, one device 206 of the flash devices is targeted for accelerated fatigue, i.e. wear, and has consequently worn out. A randomly addressable RAM, e.g. DRAM 208 provides a cache portal to the contents of the flash devices 202. Logic 210 is responsible for mapping flash addresses from processor 204 to addresses in the DRAM 208. The DRAM 208 in turn caches code and data from the flash devices 202 in accordance with a cache management policy, such as 'most frequently used' or some other. Logic 210 facilitates the transfer of information from the flash devices 202 to the DRAM 208 in accordance with the cache management policy. Logic 210 provides functionality to concentrate write backs from DRAM 208 to a targeted flash device 206. Logic 210 tracks the wear of targeted device 206 and automatically disables the device 206 when at or near the end of useful life. An indication (visual, audible, or via peripheral devices of the system) may be provided to maintenance personnel that the targeted device 206 should be replaced. Targeted device 206 may be automatically powered off for replacement by logic 210 or other logic of the system. It may be desirable to target multiple flash devices simultaneously for accelerated wear, to provide a greater bandwidth to and from the flash array, in which case multiple targeted devices may be identified for replacement at or close to the same time. Nonvolatile memory may be mechanically configured in the form of a removable, a pluggable cartridge.

One embodiment of a practical implementation comprises 16 NAND flash devices formed into one linear memory. A DRAM memory is deployed as cache for the flash memory space. The DRAM is divided into cache lines, each of which maps to some memory region in the flash space. As the system operates, some DRAM locations are modified, and at some point (e.g. LRU, Least Recently Used) a write-back takes place to the flash memory. The NAND flash memory requires an 'erase' before writing data. Instead of erasing and re-writing the same physical space in flash that was mapped to the DRAM cache line being written back, the write-back is re-directed to an address in the NAND flash device targeted for wear. This way, writes are accumulated over time in the same physical NAND flash blocks. A NAND flash block could be 128 Kbytes. In the DRAM there might be 128 Mbytes, for 1000 blocks total. With 16 NAND devices, there would be 8000×16 blocks. (8000 blocks per device).

A pre-erased block of the NAND flash may be targeted. For example, the system may target device 0, block 0, for a write-back. The next write may be directed to device 1 block 1 because block 0 is taken. Eventually, the device gets 'full', meaning there are no erased blocks to target. Some of the blocks written are 'dirty', meaning data is invalid (out of date) and can be erased. The system erases those and targets them for the next set of write-backs. This process continues, until device 0 gets too full of valid data. At this point housekeeping logic may take effect to move some or all of the valid data to another chip, erase device 0, and start over. This is only one example of how wear-concentration might be accomplished. Other techniques involving other housekeeping and targeting approaches will now be readily apparent to those skilled in the art.

Figure 3:
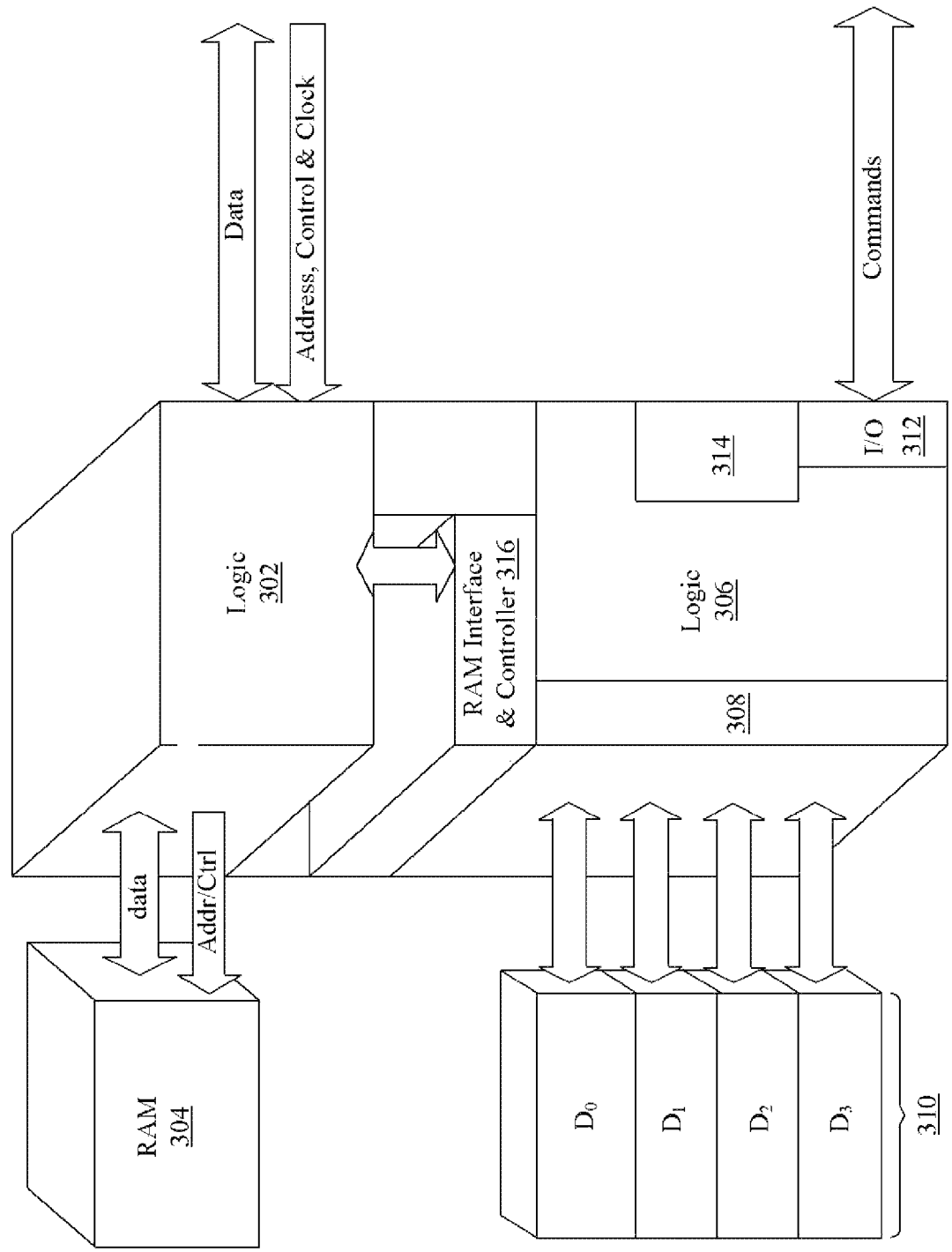
FIG. 3 is an illustration of an embodiment of a memory system in accordance with a flash memory array comprising plural memory devices.

FIG. 3 is an illustration of an embodiment of a memory system employing wear concentration. A flash memory array 310 comprises memory devices $D_0$ to $D_3$. A flash interface 308 communicates signals (data, address, etc) to and from the flash array 310. Logic 306 drives interfaces 308 and 316 and monitors activity to determine when certain blocks of flash 310 are being used (erased/written). Logic 306 may comprise memory 314 and I/O functionality 312 to implement a slice control, whereby identical FIG. 3 blocks may be cascaded for a wider or deeper memory system.

Logic 306 may re-arrange the contents of flash 310 from time to time to facilitate the concentration of wear on one or a few flash devices. Logic 306 may communicate information to logic 302 via interface 316, and vice-versa. The information may comprise data read from flash 310 and data for writes to flash. (This is only one manner in which logic 306 and logic 302 may interact).

Address mapping logic may in some implementations be provided by memory 314 (e.g. inside slice controller). The memory 314 may be written to flash 310 on power down to achieve non-volatility. The mapping logic may map cache lines of RAM 304 to flash addresses, and/or map reads and writes from a host to flash 310.

Logic 306 may map commonly written memory addresses of flash to memory addresses of the device or devices targeted for accelerated wear. A write back from RAM 304 to one of these addresses may be mapped to a write in one of the target devices. A read from one of these addresses may be mapped to a read from one of the target devices. The target device(s) will experience proportionally more writes and erases as a result of the mapping, and will thus wear out sooner.

Figure 4:
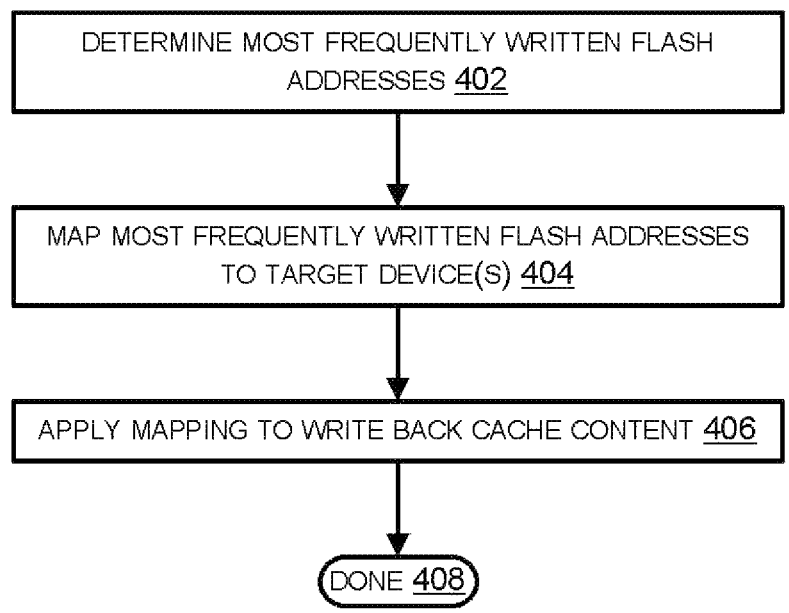
FIG. 4 is a flow chart of an embodiment of a process of wear concentration in a memory device.

FIG. 4 is a flow chart of an embodiment of a process of wear concentration in a memory device. A determination is made of which memory locations are most frequently written (402). In this instance, the memory technology may be NAND flash, in which count of writes (and erases) are a strong indicator of wear. The most frequently written flash addresses are mapped to addresses of the target device (404). During write backs from a cache memory (such as a RAM cache portal to a flash memory array), mapping is applied so that the write-backs are favorably applied to memory locations of the target device (406). The process concludes 408. In this manner, the target device will experience accelerated wear and will wear out sooner than other devices of the memory array. Not all implementations will involve determining the most frequently written memory locations.

In the process described for FIG. 4, the most frequently accessed memory locations may be cached as part of a general cache management policy. It may be sufficient to map the write-back addresses of all cache contents to the target device (s), without specifically identifying those with higher write frequency. Housekeeping may be applied to the flash from time to time to help ensure that the data in the target device is the data being written most frequently.

Figure 5:
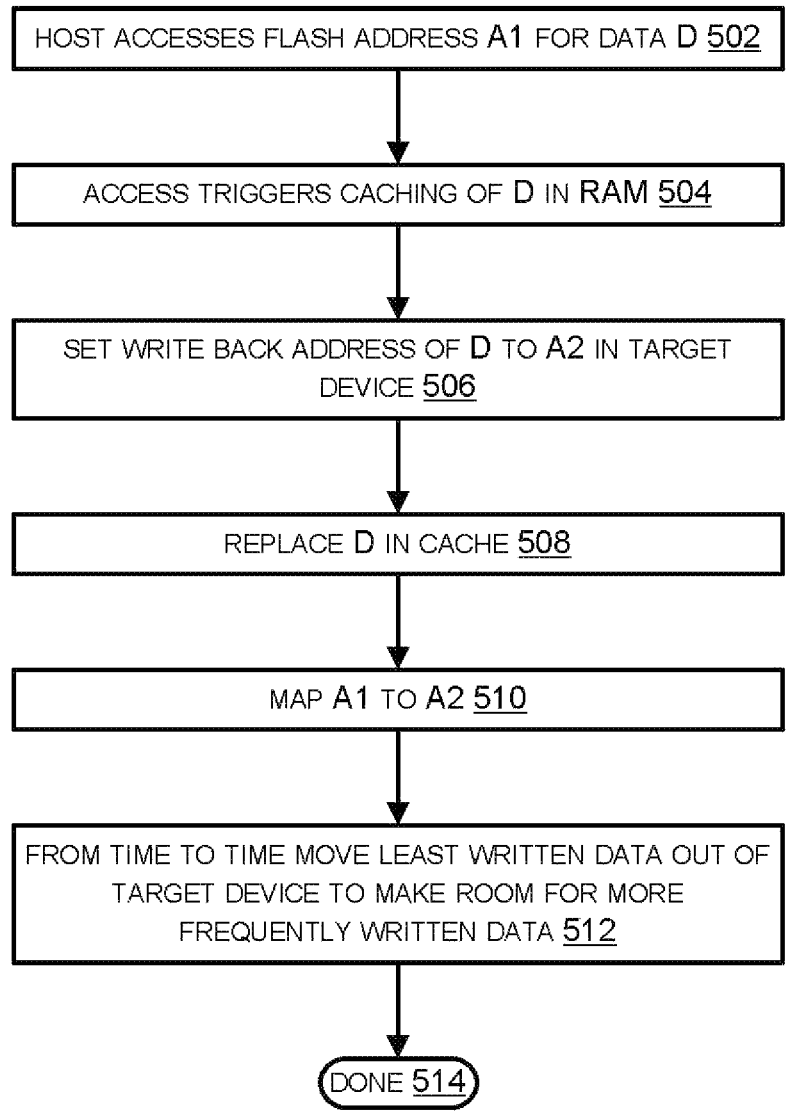
FIG. 5 is a flow chart of an embodiment of a process of wear concentration in a memory device.

FIG. 5 is a flow chart of an embodiment of a process of wear concentration in a memory device. The host issues a data access request for data D at virtual address V1 which maps to nonvolatile (e.g. flash) physical address A1 (502). In some embodiments, the host may not use virtual addressing and may reference physical addresses in the volatile memory or even a physical address in the nonvolatile (e.g. V1 may be a physical address in RAM or flash). Whether or not this access triggers the caching of D in volatile memory will depend on the cache contents, cache management policy, and other factors. Assuming the access to V1 results in caching, D is read from nonvolatile address A1 and cached (504) in volatile memory, and the write back address for D is set to physical nonvolatile address A2 (506). At some future time D is replaced in the cache (508). This may occur when other data is deemed more frequently accessed than D and therefore more deserving of being cached. D will be written back to A2 in the target device of nonvolatile memory. The target flash device experiences some wear, but the device that originally stored D (at address A1) does not experience wear. Now, the (usually virtual) address V1 is mapped to A2. If the host issues another access for D at V1, the request will be routed to A2 in the target device (where the updated D resides).

From time to time, housekeeping may be performed to help ensure that data that is written infrequently is not taking up space in the target device. For example, if it turned out that D was not written very often, it might be moved back to its original location at A1, freeing up space in the target device for data that is written more often. As another example, once the target device becomes full of valid data, some or all of the data in the device may be moved to other devices, and the target device may then be erased all at once.

Figure 6:
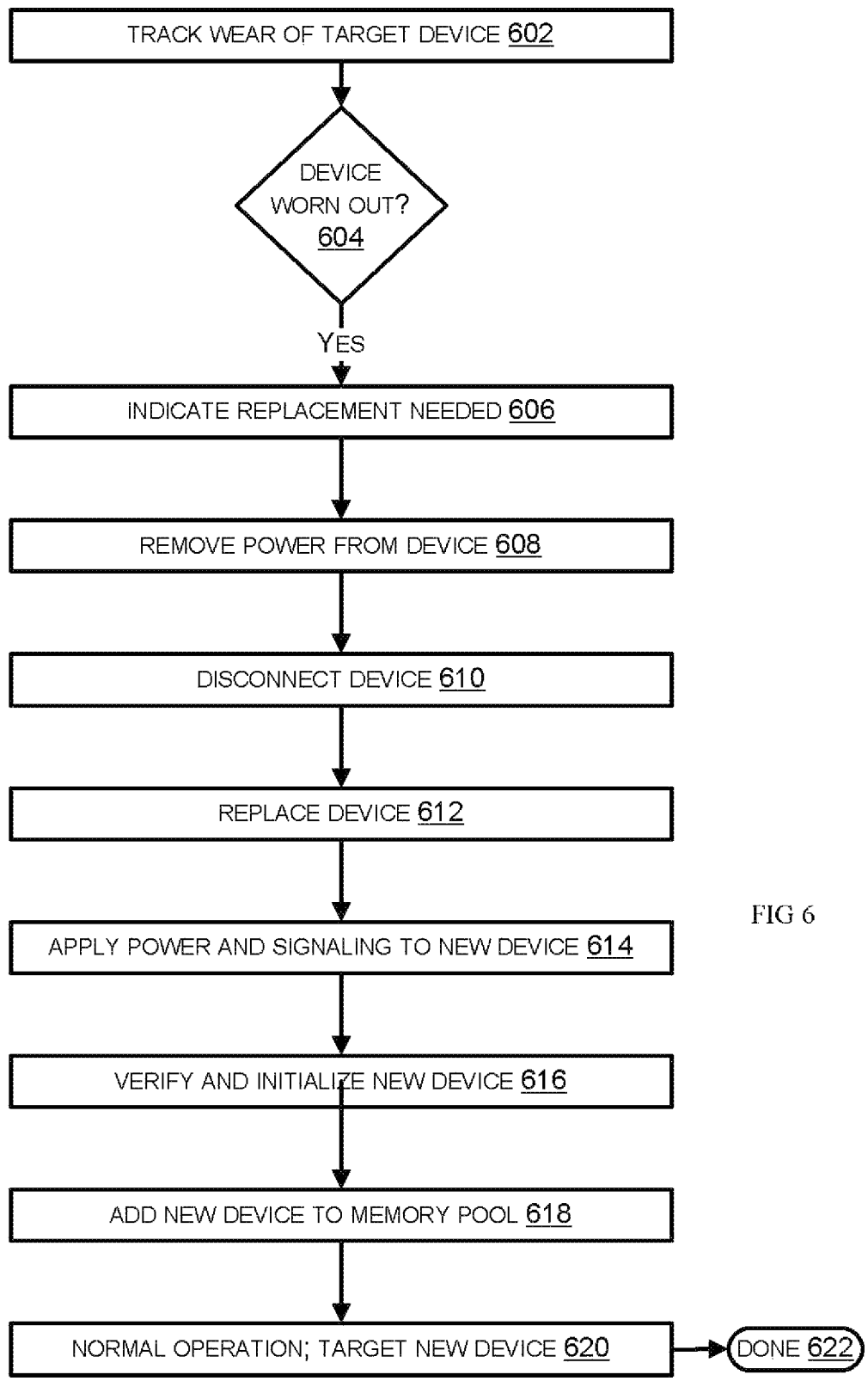
FIG. 6 is a flow chart illustrating an embodiment of a replacement process for memory devices.

FIG. 6 is a flow chart illustrating an embodiment of a replacement process for memory devices. The system tracks the wear of a targeted device (602). When the device is sufficiently worn out (604), an indication is provided that the device requires replacement (606). The indication may identify the actual physical device requiring replacement (e.g. using lights, display map, etc.). Power is removed from the device (608), possibly without human operator intervention, and the device is disconnected electrically from most or all signal pins (610). The device is removed and a new device is inserted in its place (612). Power and signaling are applied to the device (614). The new device's functionality is verified and it is initialized (616). The new device is added to the pool of working memory devices (618), and the system returns to normal operation, targeting a different device for wear (620) (e.g. the next most worn out device in the pool).

The nonvolatile memory may be packaged in a cartridge (a modular housing with an interface for power, control, address, and data). The cartridge may include logic to track wear on the non-volatile memory resulting from one or both of erases and writes (e.g. tracking erase count and/or write count overall or to specific address blocks, pages, or other locations). The cartridge may further comprise logic to determine when the nonvolatile memory is nearing or at end of useful life, and to provide an indication (e.g. visual, audible, or signals to the system and/or a display) that the nonvolatile memory requires replacement. The memory cartridge may further comprise logic to isolate the cartridge from system power and signals automatically when the nonvolatile memory is nearing or at end of useful life. The cartridge may provide indications that (a) the nonvolatile memory requires replacement, (b) the nonvolatile memory is nearing a time when it will require replacement, and/or (c) the nonvolatile memory is operating within its normal life span. Alternatively the tracking and status indication logic may be located external to the cartridge, or else divided between the cartridge and an external system receiving the cartridge (refer to FIG. 8).

Figure 7A:
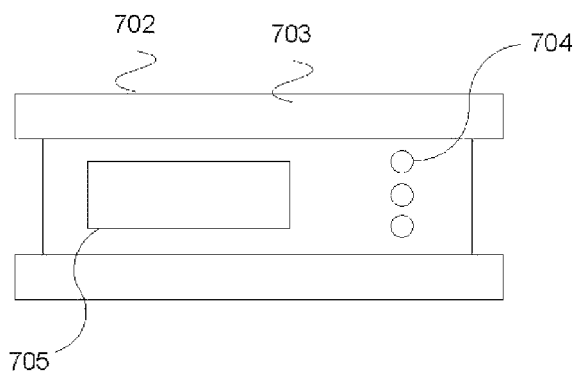
FIG. 7A is an illustration of a front view of an embodiment of a memory cartridge with built-in wear tracking and/or wear status indication.

FIG. 7A is an illustration of a front view of an embodiment of a memory cartridge with built-in wear tracking and/or wear status indication. The cartridge 702 comprises a lip 703 facilitating insertion and removal of the cartridge to and from the memory system by providing a way for a human operator to grab onto the cartridge to push it in or pull it free. Of course a lip is only one example of a manner in which a cartridge may be adopted to facilitate physical engagement. A cartridge comprises visual indicators 704 of the wear status of the cartridge. In other embodiments the indications may be audible. The indicators may indicate when the cartridge is worn out and in need of replacement, whether it is nearing a point of being worn out or nearing replacement, whether it is still within a safe useful life span, and other wear-related status. These are only examples of the indications of wear status that may be employed by various embodiments of a memory cartridge. A visual display 705 may indicate the wear status via symbols display thereon. For example, in one embodiment the status may be indicated by words, to the effect "cartridge requires replacement", or "warning-replacement imminent", or some other visual, textual, or numeric indication of cartridge wear status. The display 705 may, for example, indicate how many write and/or erase cycles the cartridge or portions therefore have been subjected to, which is indicative of wear status. Other indications of wear status will be apparent now to those skilled in the art.

Figure 7B:
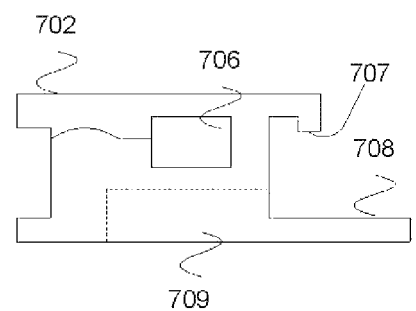
FIG. 7B is a side view illustration of an embodiment of a replaceable memory cartridge with built-in wear tracking and/or wear status indication.

FIG. 7B is a side view illustration of an embodiment of a replaceable memory cartridge with built-in wear tracking and/or wear status indication. Logic 706 may track a number of erase and/or write cycles to which the memory 709 comprised by the cartridge 702 has been subjected, thereby providing tracking of the cartridge's wear status. The cartridge may be engaged with the memory system via lip 707 which may function to secure the cartridge within the system when electrical interface 708 engages with signaling and power buses (for example, data, address, and control buses) from a memory system in which the cartridge is engaged.

Figure 8:
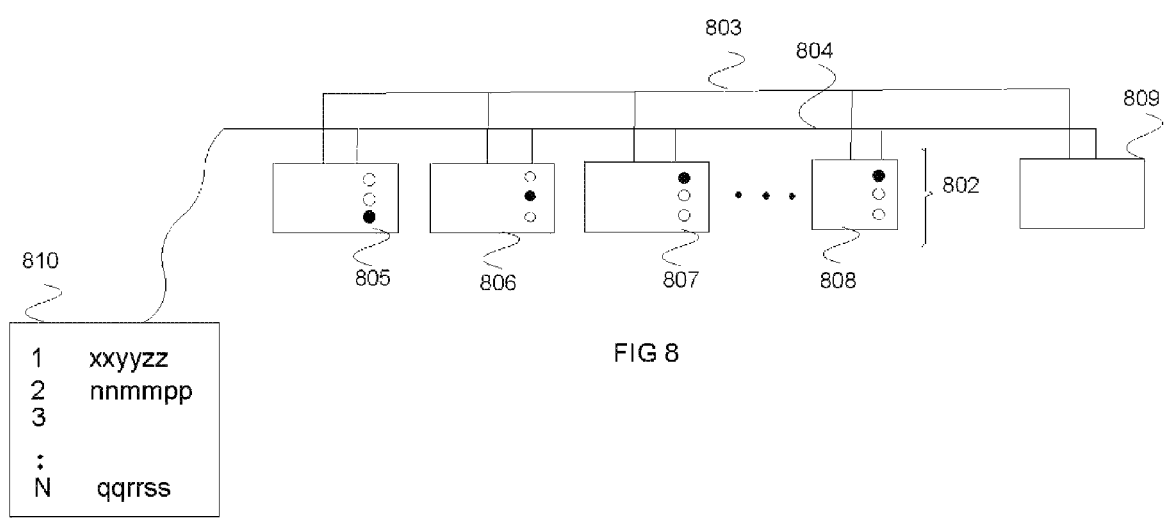
FIG. 8 is an illustration of an embodiment of a memory system with wear tracking and wear status indications.

FIG. 8 is an illustration of an embodiment of a memory system with wear tracking and wear status indications. The system comprises plural memories cartridges 802 which are separately removable. Cartridge 805 is illustrated indicating a status of at or exceeding its end of a useful life. Cartridge 806 comprises an indication that the cartridge is nearing the point where a replacement should be considered and will soon transition to a status of being worn out. The remaining cartridges in the system, e.g. 807 and 808, indicate a status of being within the normal wear tolerance for such cartridges and therefore not in need of imminent replacement. The memory cartridges 802 are coupled to a signaling bus 804 by which indications of the cartridge's wear status may be communicated to display 810. The display provides status information associated with identifications of particular cartridges in the system. The system further comprises a power bus 803 by which power may be selectively delivered or removed to individual memory cartridges 802. It may be advisable to blink or otherwise vary one or more of the indicators to more easily attract attention to memory cartridges that require attention.

Memory cartridges 802 communicate status information directly to display 810 or to memory management logic 809 which determines, for example if a number of write cycles and/or erases have been exceeded for a particular memory cartridge and thereby determines the wear status displayed for the memory cartridge. The logic 809 may further enable a 'hot swapping' (replacement without turning off system power) capability whereby the logic 809 may selectively control the power provided to cartridges via power bus 803. When a cartridge enters a status whereby its wear has exceeded its rated value, power for that cartridge may be selectively disengaged and the cartridge removed from the system and replaced with a new cartridge. Not all memory cartridges will require disengaging power before being removed from the system. Some cartridges may have the capability to be physically disengaged or engaged with power continuously delivered to their system interface. This capability will be present or not depending on the implementation. Furthermore, in some embodiments the cartridge itself may comprise logic to disengage itself from system power and signaling. In systems where separate logic is used to monitor and/or provide for the display of the cartridge status, it may not be necessary to also include the indication on the cartridge of the cartridge status, although doing so may provide a second level of indication or monitoring of cartridges status, depending on the implementation.

A memory cartridge in accordance with the teachings herein may thus include a non-volatile memory, and logic to provide an indication that the nonvolatile memory requires replacement in response to a signal from wear tracking logic external to the memory cartridge. The memory cartridge may include logic to isolate the cartridge from system power and signals automatically as a result of receiving the signal from the wear tracking logic. The memory may include logic to provide a visual indication that the nonvolatile memory, requires replacement; in some embodiments, the visual indication may also being an indication of whether the memory cartridge is powered or not. In other words, when power is automatically removed from the memory cartridge due to excessive wear, a visual indication that the cartridge is unpowered may also provide an indication that it is worn out.

A memory cartridge may include logic to provide a visual indication that (a) the nonvolatile memory requires replacement, (b) the nonvolatile memory is nearing a time when it will require replacement, (c) the nonvolatile memory is operating within its normal life span, where each indication is provided in response to a signal from wear tracking logic external to the memory cartridge.

A memory system in accordance with the teachings herein may include a plurality of removable memory cartridges, each comprising nonvolatile memory, and logic to track wear on each nonvolatile memory and to provide indications of the wear status of the nonvolatile memories to one or more of (a) the memory cartridges, (b) a display, or (c) a host system comprising the memory system. The memory may include logic to disengage power from a memory cartridge that has reached or exceeded its wear limit. The memory system may include logic to monitor a control signal bus for the memory cartridges for one or more of erase and write commands, and to track an accumulation of such commands for the nonvolatile memory of individual cartridges.

Implementations and Alternatives

The routine and somewhat predictable replacement of worn out memory devices (like replacing printer ink or copier toner) may involve non-volatile memory devices (e.g. NAND flash devices) to be used as replaceable cartridges comprising wear tracking logic and/or wear status logic.

The techniques and procedures described herein may be implemented via logic distributed in one or more computing devices. The particular distribution and choice of logic is a design decision that will vary according to implementation.

"Logic" refers to signals and/or information embodied in circuitry (e.g. memory or other electronic or optical circuits) that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory system comprising:
   a volatile memory;
   a memory cartridge including a non-volatile memory, the volatile memory configured to act as a read/write buffer memory for the non-volatile memory;
   nontransitory machine memory or circuitry embodying logic designed to identify and target memory locations within the non-volatile memory for accelerated wear over other areas of memory locations within the non-volatile memory; and to configure memory direction logic to concentrate memory write-backs from the volatile memory to the non-volatile memory within the targeted area preferentially over the other areas; thus causing the non-volatile memory to wear out over time in a uneven manner; wherein the memory direction logic is replacement logic for the volatile memory;
   and
   logic to track wear on the non-volatile memory resulting from the memory operations.

2. The memory cartridge of claim 1, further comprising:
   the nonvolatile memory is NAND flash; and
   nontransitory machine memory or circuitry embodying logic to identify data in the non-volatile memory that is more frequently written and data in the non-volatile memory that is less frequently written than the more frequently written data, and to periodically move the less frequently written data out of the memory locations identified and targeted for accelerated wear.

3. The memory cartridge of claim 1, further comprising:
   logic to determine the nonvolatile memory has reached a wear point at which the nonvolatile memory is nearing or at end of useful life; and
   logic to provide an indication that the nonvolatile memory requires replacement.

4. The memory cartridge of claim 3, further comprising:
   logic to provide a visual indication that the nonvolatile memory requires replacement.

5. The memory cartridge of claim 4, further comprising:
   logic to provide a visual indication that (a) the nonvolatile memory requires replacement, (b) the nonvolatile memory is nearing a time when it will require replacement, (c) the nonvolatile memory is operating within its normal life span.

6. The memory cartridge of claim 4, further comprising:
the visual indication also being an indication of whether power is applied to the memory cartridge or not.

7. The memory cartridge of claim 1, further comprising:
logic to isolate the cartridge from system power and signals automatically when the nonvolatile memory is reaches a wear point associated with nearing or at end of useful life.

8. The memory cartridge of claim 1, further comprising:
logic to track an erase count of memory locations of the nonvolatile memory.

9. The memory system of claim 1, wherein the replacement logic identifies most frequently updated memory locations of the volatile memory for mapping, preferentially over other locations of the volatile memory, to the memory locations in the non-volatile memory identified for accelerated wear.

10. A memory system comprising:
a non-volatile memory;
a volatile memory configured to act as a read/write buffer memory for the non-volatile memory;
nontransitory machine memory or circuitry embodying logic designed to identify and target memory locations within the non-volatile memory for accelerated wear over other areas of memory locations within the non-volatile memory; and to configure memory direction logic to concentrate memory write-backs from the volatile memory to the non-volatile memory within the targeted area preferentially over the other areas; thus causing the non-volatile memory to wear out over time in a uneven manner; wherein the memory direction logic is replacement logic for the volatile memory;
and
nontransitory machine memory or circuitry embodying logic to provide an indication that the nonvolatile memory requires replacement in response to a signal from wear tracking logic external to the memory cartridge.

11. The memory cartridge of claim 10, further comprising:
the nonvolatile memory is NAND flash.

12. The memory cartridge of claim 10, further comprising:
logic to isolate the cartridge from system power and signals automatically as a result of receiving the signal from the wear tracking logic.

13. The memory cartridge of claim 12, further comprising:
logic to provide a visual indication that the nonvolatile memory requires replacement, the visual indication also being an indication of whether the memory cartridge is powered or not.

14. The memory cartridge of claim 13, further comprising:
logic to provide a visual indication that (a) the nonvolatile memory requires replacement, (b) the nonvolatile memory is nearing a time when it will require replacement, (c) the nonvolatile memory is operating within its normal life span;
each indication provided in response to a signal from wear tracking logic external to the memory cartridge.

15. A memory system comprising:
a volatile memory;
a plurality of removable memory cartridges, each comprising nonvolatile memory, the volatile memory configured to act as a read/write buffer memory for the non-volatile memory of the memory cartridges;
nontransitory machine memory or circuitry embodying logic designed to identify and target memory locations within the non-volatile memory for accelerated wear over other areas of memory locations within the non-volatile memory over time; and to configure memory direction logic to concentrate memory write-backs from the volatile memory to the non-volatile memory within the targeted area preferentially over the other areas; thus causing the non-volatile memory to wear out over time in a uneven manner; wherein the memory direction logic is replacement logic for the volatile memory;
nontransitory machine memory or circuitry embodying logic to track wear on each nonvolatile memory and to provide indications of the wear status of the nonvolatile memories to one or more of (a) the memory cartridges, (b) a display, or (c) a host system comprising the memory system.

16. The memory system of claim 15, comprising:
logic to disengage power from a memory cartridge that has reached or exceeded its wear limit.

17. The memory system of claim 15, comprising:
logic to monitor a control signal bus for the memory cartridges for one or more of erase and write commands, and to track an accumulation of such commands for the nonvolatile memory of individual cartridges.

18. A memory system comprising:
volatile memory;
a plurality of removable memory cartridges, each comprising nonvolatile memory, the volatile memory configured to act as a read/write buffer memory for the non-volatile memory of the memory cartridges;
nontransitory machine memory or circuitry embodying logic designed to identify and target memory locations within the non-volatile memory for accelerated wear over other areas of memory locations within the non-volatile memory; and to configure memory direction logic to concentrate memory write-backs from the volatile memory to the non-volatile memory within the targeted area preferentially over the other areas; thus causing the non-volatile memory to wear out over time in a uneven manner; wherein the memory direction logic is replacement logic for the volatile memory;
nontransitory machine memory or circuitry embodying logic external to the memory cartridges to track at least one of a number of erases and writes to each removable memory cartridge; and
logic to provide indications that one or more of the removable cartridges are at or exceeding their useful life.

19. The memory system of claim 18, comprising:
logic to disengage power from a memory cartridge that has reached or exceeded its useful life.

20. The memory system of claim 18, comprising:
logic to monitor a control signal bus for the memory cartridges for one or more of erase and write commands, and to track an accumulation of such commands for the nonvolatile memory of individual cartridges.

* * * * *